Dec. 26, 1967 J. LINDMAYER 3,360,695

INDUCED REGION SEMICONDUCTOR DEVICE

Filed Aug. 2, 1965

INVENTOR
Joseph Lindmayer

BY Connolly and Hutz
ATTORNEYS

United States Patent Office 3,360,695

Patented Dec. 26, 1967

3,360,695

INDUCED REGION SEMICONDUCTOR DEVICE

Joseph Lindmayer, Williamstown, Mass., assignor to Sprague Electric Company, North Adams, Mass., a corporation of Massachusetts Filed Aug. 2, 1965, Ser. No. 476,377
9 Claims. (Cl. 317—234)

ABSTRACT OF THE DISCLOSURE

In a surface of a semiconductor, a stabilized inversion layer is induced by impurities of an overlying insulating layer which have a work function unequal to that of the insulating material or the semiconductor.

This invention relates to semiconductor devices and more particularly to induced region semiconductor devices and a method of manufacturing the same.

Induced regions or inversion layers, usually undesirable, are known to exist at the surface of semiconductor material due to surface elements such as contaminants. In addition, such regions are also induced by the conventional oxide employed as a protective surface coating on silicon semiconductors.

Accordingly, a somewhat unstable N-type inversion layer is induced in the low conductivity surface portions of the semiconductor by the silicon dioxide coating. Such regions, generally, cause both increased leakage and capacitance and are therefore detrimental to the conventional device.

Consequently, although means have been employed to negate the region inducing effects of the oxide coating, the indicated inversion layer is not utilized in most devices as a useful region; and is generally unstable and uncontrolled.

It is an object of this invention to provide semiconductor devices utilizing induced regions.

Another object of this invention is to provide an induced semiconductor resistor.

Yet another object of this invention is to provide a microcircuit having induced interconnections between circuit elements.

A further object of this invention is to provide a method of fabricating an induced resistor having a particular resistive value and temperature coefficient.

A still further object of this invention is to provide a method of fabricating microcircuit interconnections.

These and other objects of this invention will become apparent from the following specifications and the accompanying drawing in which.

In its broadest scope the invention provides a semiconductor device comprising a body of semiconductor material, an insulating coating overlying the body, at least a portion of the coating modified by an impurity, and a region having different conductivity than the body induced beneath the modified coating.

Briefly, the process for forming a semiconductor device in accordance with the invention comprises the steps of forming a body of semiconductor material, forming a coating overlying at least a portion of the body, and modifying at least a portion of the coating to induce a region within the body of different conductivity characteristics than the body.

In the preferred embodiment the process of forming a resistor comprises the steps of forming a monocrystalline silicon body, forming a silicon dioxide coating over the body, stabilizing at least a portion of the coating and modifying the stabilized portion by diffusion within the coating of high or low work function materials to induce within the body a region of particular resistivity and thermal coefficient.

Figure 1:
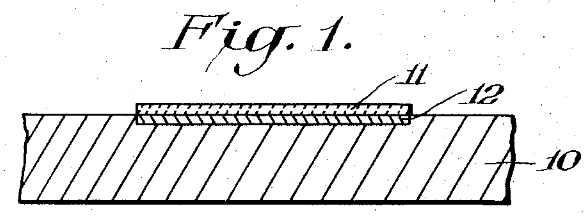
FIGURE 1 is a view in section of an induced region produced in accordance with the invention.

Referring to the drawing and more particularly to FIGURE 1 thereof there is shown an induced region 12 at the surface of a semiconductor body 10 beneath an inducing coating 11.

The structure is produced by first forming a monocrystalline body or wafer 10 of low P-type semiconductor material such as silicon or the like in accordance with principles well known in the art. Next, an insulating coating, such as silicon dioxide or the like, is provided over the surfaces of the body by, for example, thermal oxidation. Thereafter, by suitable technique such as a photoresist procedure, the oxide is partly removed to leave a residual strip or layer 11 positioned on one of the surfaces of the body 10 as shown.

Accordingly an unstable N-type inversion layer or channel 12 is induced beneath the coating 11 since silicon dioxide possesses a lower work function than silicon. This channel or region is then modified to provide the desired region 12 by stabilizing and adding low or high work function impurities to coating 11.

The inherent inversion layer is first stabilized by eliminating the ionic contributions of the oxide by, for example, heating the structure at approximately 250° C. for 48 hours or more. At this phase of the process, the stable channel or region 12 induced beneath the coating 11 will have a resistance of approximately $10^5$ ohms per square and a temperature coefficient of —.1%/degree C. The resistance depends to some extent upon the thickness and growth conditions of the oxide but has in all cases a negative temperature coefficient of resistance.

The desired resistance and temperature coefficient is then induced by the addition of suitable impurities to the coating 11. Thus a low work function impurity, such as aluminum or the like, or a high work function impurity, such as platinum or the like, are incorporated in coating 11 by, for example, solid state diffusion.

For example aluminum is deposited in a desired pattern over the coated area by suitable means, such as vapor deposition or the like, and the structure fired at 300° C. or higher to diffuse the impurity into the underlying coating 11. Any remaining metallic surface deposit is then removed by etching or the like.

By this means, a region 12 having a desired resistivity and temperature coefficient may be realized. The addition of an impurity such as aluminum, having a lower work function than the silicon body 10, reduces the resistivity of region 12 and changes the temperature coefficient to positive values, whereas the introduction of platinum, having a higher work function than silicon, has an opposite effect.

The change in region characteristics is generally dependant upon the work function of the impurity as compared to the work function of the semiconductor and the coating. Accordingly the addition of aluminum, having a lower work function than the silicon-silicon dioxide system, increases the density of induced electrons, making region 12 more N-type and also reduces the rate of change of electron density with temperature. Whereas the addition of high work function platinum decreases the density to provide a more P-type region and increases the rate of change with temperature.

Consequently, both the resistivity and the temperature coefficient can be altered. The resistivity is, of course, primarily dependant upon the electron density whereas the temperature coefficient is a function of the change in density with temperature. Now in the inherent region, induced by unmodified silicon dioxide, the density increases with temperature more rapidly than the mobility decreases such that a lowering of resistance or a negative temperature coefficient results.

With the addition of aluminum, however, the increase with temperature no longer exceeds the decrease in mobility and a positive temperature coefficient results. Conversely, the introduction of platinum has an opposite effect.

It has been demonstrated experimentally, that only a small amount of change in the oxide will alter the region characteristics as indicated. Thus, for example, an aluminum concentration of as low as a few parts per million within the oxide will reduce the resistance by about a factor of 3 and change the temperature coefficient to positive values.

By this means, region 12 having a desired resistivity and temperature coefficient may be provided for use as a discrete resistor or as interconnections for monolithic integrated circuits.

It should be understood, however, that since region 12 is induced, any contact must be made without removing the inducing coating 11. This may be accomplished, for example, by forming N-type zones contiguous with opposite ends of region 12, as illustrated in FIGURE 2, or by allowing metallic contacts 16 to penetrate coating 11 at each end of region 12, as shown in FIGURE 3.

Figure 2:
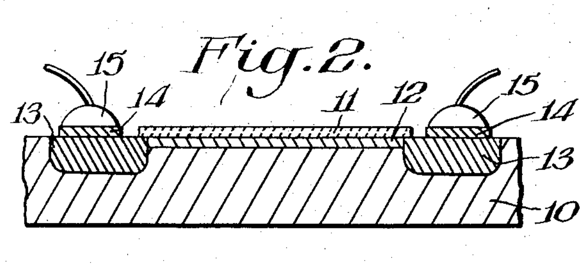
FIGURES 2 and 3 are views in section of completed resistors produced in accordance with this invention.

In FIGURE 2, N-type zones 13 are shown at opposite ends of region 12 within a P-type body 10. The induced region 12 is provided, as indicated, by appropriate modification of the oxide 11. Zones 13 may be formed by diffusion or the like of phosphorus or other suitable N-type impurities, either before or after the inducing of region 12. Thereafter, suitable leads 15 of gold or aluminum or the like are applied to the zones 13 to complete the resistor.

Figure 3:
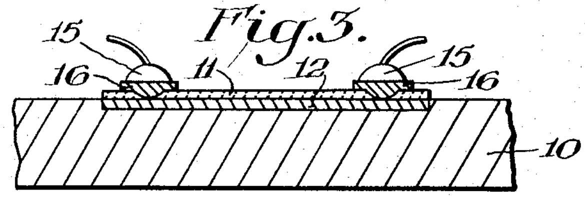

The application of contacts by metallic penetration of the oxide coating is illustrated in FIGURE 3 where a metallic deposit 16 is shown penetrating coating 11 and contacting each end of region 12.

The structure is formed by inducing region 12 within a silicon body 10 by a modified coating 11 as described above. Thereafter a portion of coating 11 adjacent each end of region 12 is weakened by etching or the like and a metal pad 16 such as gold or aluminum deposited upon the weakened area. Pad 16 is then made to penetrate coating 11 and contact region 12 by heating the structure at approximately 500° C. or higher. Leads or terminals 15 of gold or the like may then be attached by thermo-compression bonding, soldering, welding or the like to complete the resistor.

Figure 4:
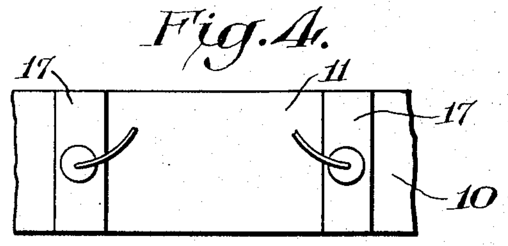
FIGURES 4 and 5 are plan views illustrative of resistors produced in accordance with this invention.
Figure 5:
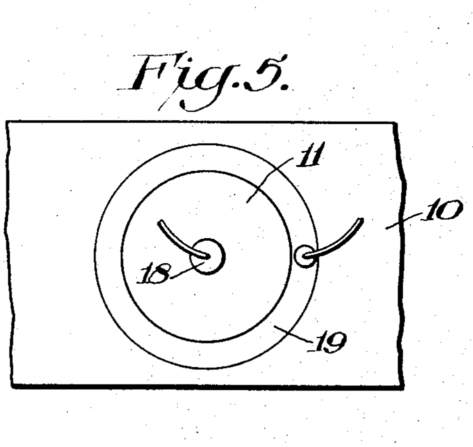

Either type of contact may be made in a variety of shapes. For example, contact zones or penetrating pads may be formed, as shown in FIGURE 4, as strips 17 transverse to an induced region underlying a modified coating 11. Furthermore, such contacts may be concentric circles as shown in FIGURE 5; wherein the modified coating 11 induces a region, not shown, around a center contact 18 and enclosed by outer contact 19.

The described resistor may be constructed individually or in large number within a single substrate. It may also be utilized within integrated circuits or microcircuits to form the resistive portions of the network and interconnect circuit components. For such use, leads are not generally desirable and, in such cases, the induced region would contact other circuit elements within the substrate; however, contact could also be made with the described metallic pads by extending the pads to other elements of the circuit.

Figure 7:
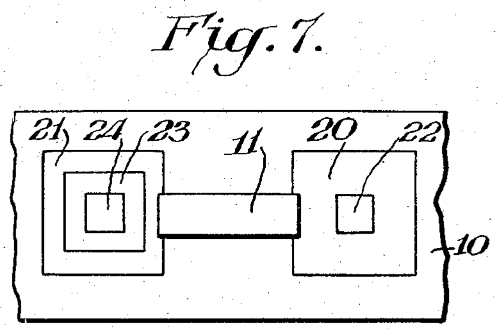
FIGURE 7 is a plan view of the microcircuit illustrated in FIGURE 6.
Figure 6:
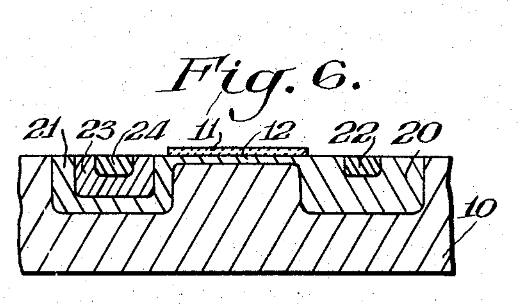
FIGURE 6 is a view in section illustrative of a microcircuit interconnected in accordance with this invention.

An example of the use of the induced resistor as a portion of a microcircuit is shown in FIGURES 6 and 7 wherein an induced region 12 is shown underlying the modified coating 11 and contacting or contiguous with separated devices of a microcircuit.

Thus, a P-type substrate 10 is shown having N-type zones 20 and 21 of separate devices connected within the substrate by an induced region 12. Each device may be of a different type; that is zone 20 may be utilized as the anode of a diode having a P-type cathode 22, and zone 21 as the collector of an NPN transistor having a P-type base region 23 and N-type emitter 24. It should also be obvious that zone 20 could be utilized as the base of a PNP transistor having region 22 as its emitter and substrate 10 as its collector.

The structure shown may be produced by forming a low conductivity P-type substrate 10 of monocrystalline silicon or the like having an overlying insulating coating such as silicon dioxide. Thereafter, spaced apart N-type zones 20 and 21 are provided by diffusion or the like of N-type impurities through openings provided within the oxide. P-type regions 22 and 23 are similarly formed within zones 20 and 21 and an N-type emitter region 24 is formed within region 23.

An induced resistor 12 is formed by modifying the coating 11 overlying the separation between the N-type regions 20 and 21 to connect these regions and provide a desired resistance between them.

As shown, the coating has been removed except where the induced region 12 is provided, however, it should be understood that a desired channel may be induced by treating only a portion of the coating without removing the remaining coating. A further coating may also be provided over the modified coating. The induced region 12 could also be formed before the diffused regions.

A further advantage of the resistor connection for integrated circuits is that such permits a crossover of other connections since the modified coating still retains its insulating properties. Thus, metallized connections to various devices may pass over the inducing coating without disturbing the induced channel.

Although the preferred embodiment has been described as a strip or circular region, other configurations may also be employed. Thus, a region having any desired pattern may be induced. In this regard, an impurity may be deposited on the insulator in any appropriate pattern and diffused into the coating to provide an induced region similar in shape to the deposited pattern.

As indicated, many modifications are possible. For example, various insulators such as other dielectric compounds of silicon may be employed and other semiconductor materials such as germanium or intermetallics may be utilized with appropriate insulating coating. Moreover, induced P-type channels may also be formed within a low conductivity N-type body by the addition to the coating of a high work function impurity.

Other means of introducing the impurity are also useful. Thus, the impurity may be deposited on the semiconductor surface or a thin insulator coating and an oxide layer then thermally grown over the impurity such that the impurity is incorporated within the coating.

Consequently, it should be understood that many modifications of this invention may be made without departing from the spirit and scope herein and that the invention is not to be limited except as defined in the appended claims.

What is claimed is:

1. A semiconductor device comprising a body of semiconductor material of one conductivity type having an altered region in a surface thereof forming a stabilized inversion layer therein, a layer of insulating material containing electrically active impurities overlying said inversion layer, said impurities having a work function unequal to the work function of said semiconductor material and said insulating material, and the numerical values of the resistivity and the temperature coefficient of resistance of said inversion layer being proportional to the differential of said unequal work function.

2. A device as claimed in claim 1 wherein said body is monocrystalline silicon and said coating is silicon dioxide.

3. A device as claimed in claim 1 wherein said body is monocrystalline silicon and said coating is a dielectric compound of silicon.

4. A device as claimed in claim 1 including a zone of the other conductivity type contacting an end of said region.

5. A device as claimed in claim 1 including a metallic contact penetrating said coating to provide a low resistance connection to said region.

6. A device as claimed in claim 1 wherein said impurity has a low work function.

7. A device as calimed in claim 6 wherein said impurity is aluminum.

8. A device as claimed in claim 1 wherein said impurity has a high work function.

9. A device as claimed in claim 8 wherein said impurity is platinum.

References Cited

UNITED STATES PATENTS

| | | | |
|---|---|---|---|
| 3,200,019 | 8/1965 | Scott et al. | 317—235.40 |
| 3,298,879 | 1/1967 | Scott et al. | 317—235.46 |

OTHER REFERENCES (1) The Bell System Technical Journal, July 1960 pp. 933–946, an article by Atalla and Tannenbaum: Impurity Redistribution and Junction Formation in Silicon by Thermal Oxidation.

(2) IBM Journal, September 1964: pp. 376–384, an article by Kere et al., Stabilization of $SiO_2$ Layers; and pp. 368–375, an article by Thomas Jr. et al., Space-charge Model For Surface Potential Shifts; and pp. 400–409, an article by Serephim et als., Electrochemical Phenomena in $SiO_2$.

JAMES D. KALLAM, *Primary Examiner.*